(12) United States Patent
Jewell et al.

(10) Patent No.: US 6,967,445 B1
(45) Date of Patent: Nov. 22, 2005

(54) CIRCUIT CONTINUITY AND FUNCTION MONITOR

(76) Inventors: Dan J. Jewell, 913, #C, E. Fillmore St., Colorado Springs, CO (US) 80907;
Judith D. Jewell, 3915, #540, Harmony Dr., Colorado Springs, CO (US) 80917

( * ) Notice: Subject to any disclaimer, the term of this patent is extended or adjusted under 35 U.S.C. 154(b) by 0 days.

(21) Appl. No.: 10/826,068

(22) Filed: Apr. 19, 2004

(51) Int. Cl.[7] .............................. H01J 1/60; B60L 1/14; G01R 31/02; H01H 31/02
(52) U.S. Cl. ...................... 315/129; 307/10.8; 324/418; 324/556
(58) Field of Search ........................... 315/76–77, 129, 315/131, 133; 307/10.1, 10.6, 10.8, 139, 307/142; 324/418, 555–556; B60L 1/14; G01R 31/02; H01H 31/02; H01J 1/60

(56) References Cited

U.S. PATENT DOCUMENTS

| | | | | |
|---|---|---|---|---|
| 3,157,870 A | * | 11/1964 | Marino et al. | 324/435 |
| 3,437,916 A | * | 4/1969 | Mazurkevics | 324/416 |
| 3,829,763 A | * | 8/1974 | Morin | 324/503 |
| 3,872,384 A | * | 3/1975 | Laass | 324/555 |
| 3,914,687 A | * | 10/1975 | Bevins | 324/555 |
| 3,962,630 A | * | 6/1976 | Chaffee | 324/508 |
| 4,027,236 A | * | 5/1977 | Stewart | 324/556 |
| 4,327,352 A | * | 4/1982 | Cerruti | 340/459 |
| 6,359,763 B1 | * | 3/2002 | Edwards | 361/93.1 |
| 2002/0149891 A1 | * | 10/2002 | Neiger et al. | 361/42 |

* cited by examiner

Primary Examiner—Thuy Vinh Tran
(74) Attorney, Agent, or Firm—G. F. Gallinger

(57) ABSTRACT

A circuit to monitor electrical continuity through a light bulb when the light bulb is switched off, and to monitor proper functioning of the light bulb when the bulb is switched on. The circuit comprises a LED, a relay and a latching circuit portion, the latching circuit portion configured to remain latched thereby applying power to the bulb and the relay only when the bulb is switched on and lit, and the relay having a pair of normally closed contacts connected to provide an alternative path of minimal resistance to ground for low voltage applied to an incoming side of the LED, and the relay also having a pair of normally open contacts which when closed allow voltage to be applied to the outgoing side of the LED, thereby resulting in the LED lighting when and only when, the light bulb is broken. Most preferably the latching portion of the circuit comprises a silicone controlled rectifier having a trigger circuit portion configured to pulse the gate when a switched light power control line is energized. The switched light power control line is connected to the anode and a coil of the relay, and the cathode is connected to one of the normally closed contacts of the relay and to the light bulb.

12 Claims, 2 Drawing Sheets

CIRCUIT CONTINUITY AND FUNCTION MONITOR

FIELD OF THE INVENTION

This invention relates to testing of low voltage light bulbs. More particularly this invention relates to a circuit especially designed for a vehicle. The circuit monitors electrical continuity through a light bulb when the light bulb is switched off. The circuit alternatively monitors proper functioning of the light bulb when the bulb is switched on.

BACKGROUND OF THE INVENTION

Hundreds of thousands of motorists are pulled over annually because a light bulb is burnt out on their vehicle. These unscheduled and unexpected inspections frequently lead to more serious fines than those for having a burnt out light bulb. Last year Honda recalled 440,000 cars because of the safety hazard resulting from headlamps going out and the driver being unaware of the problem.

Some luxury vehicle manufacturers have ran fiber optic cable from individual lights to a location visible to the driver. But these fiber optic cables are difficult to run and maintain in operative position. Additionally they must be viewed at the time the light should be operating. Cadillacs have rear brake monitor indicators positioned inside the vehicle above the rear window. Few motorists look in their rear view mirror while they are braking. Honda uses a 2 second diagnostic test to check brake lights when the vehicle is started. The test only ensures that at least one of the four light bulbs is operative. There is no indication which light is burnt out, and there is no indication while one is driving.

OBJECTS OF THE INVENTION

It is an object of this invention to improve safety in vehicles and other equipment employing low voltage light bulbs. It is an object of this invention to disclose an improved apparatus for monitoring low voltage light bulbs. It is an object of this invention to disclose an apparatus which continuously monitors individual light bulbs when the bulb is lit and when the bulb is switched off. It is yet a further object of this invention to disclose an apparatus which discloses the location of a burnt out light bulb. The monitoring apparatus may include an audio alarm to ensure that a driver is aware of the problem.

One aspect of this invention provides for a circuit to monitor the operability of a light bulb, both while lit and unlit, comprising a LED, a relay and a latching circuit portion, said latching circuit portion configured to remain latched thereby applying power to the bulb and the relay only when the bulb is switched on and lit, and said relay having a pair of contacts connected to provide an alternative path of minimal resistance to ground for low voltage applied to an incoming side of the LED, and said relay also having an additional pair of contacts which when closed allow voltage to be applied to the outgoing side of the LED, thereby resulting in the LED lighting when and only when, the light bulb is broken.

In a preferred aspect of this circuit the contacts of the relay which are connected to provide an alternative path of minimal resistance to ground for low voltage applied to an incoming side of the LED, are normally closed; and wherein the relay contacts which are connected which when closed allow voltage to be applied to the outgoing side of the LED, are normally open.

In the most preferred aspect of this invention the latching portion of the circuit comprises a silicone controlled rectifier having a gate, an anode and a cathode, as well as a trigger circuit portion configured to pulse the gate when the switched light power control line is energised, and wherein the switched light power control line is connected to the anode and a coil of the relay, and wherein the cathode is connected to one of the normally closed contacts of the relay and to the light bulb.

Various other objects, advantages and features of this invention will become apparent to those skilled in the art from the following description in conjunction with the accompanying drawings.

FIGURES OF THE INVENTION

FIG. 1 is a schematic view of a light bulb monitoring circuit. Switched power, originally supplied to the light bulb is fed to the circuit. The light bulb, as well as ignition power, a switched light power control line, and a ground are connected to the circuit.

Figure 1:
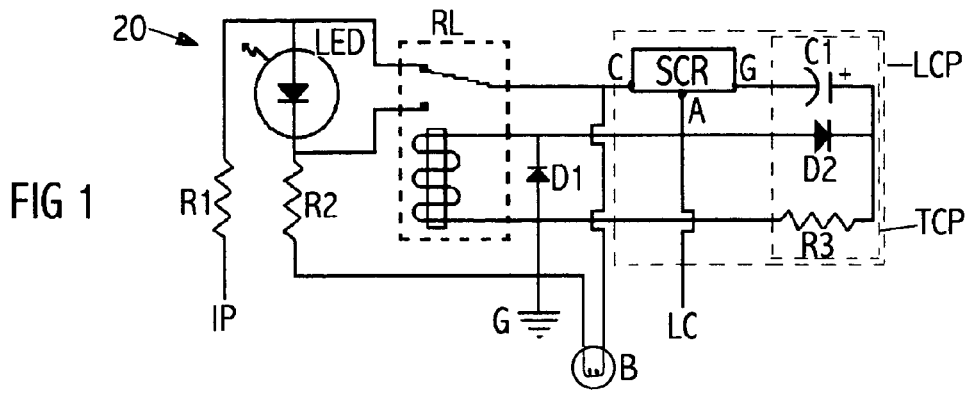

The following is a discussion and description of the preferred specific embodiments of this invention, such being made with reference to the drawings, wherein the same reference numerals are used to indicate the same or similar parts and/or structure. It should be noted that such discussion and description is not meant to unduly limit the scope of the invention.

DESCRIPTION OF THE INVENTION

Turning now to the drawings and more particularly to FIG. 1 we have a schematic view of a light bulb monitoring circuit 20. Switched power Lc, originally supplied to the light bulb B is fed to the circuit 20. The light bulb B, as well as ignition power IP, a switched light power control line Lc, and ground G are connected to the circuit 20. A method of monitoring the operability of a light bulb B, both while lit and unlit, comprises the steps of: providing a circuit 20 containing a light emitting diode LED, a relay RL and a latching circuit portion LCP, said latching circuit portion LCP configured to remain latched thereby applying power to the bulb B and the relay RL only when the bulb B is switched on and lit, and said relay RL having a pair of contacts connected to provide an alternative path of minimal resistance to ground for low voltage applied to an incoming side of the LED, and said relay RL also having an additional pair of contacts which when closed allow voltage to be applied to the outgoing side of the LED, thereby resulting in the LED lighting when and only when, the light bulb B is broken. The circuit is electrically connected to the light bulb B to be monitored, ignition power IP, a switched light power control line Lc, and ground G.

In a preferred aspect of this invention contacts of the relay RL which are connected to provide an alternative path of minimal resistance to ground for low voltage applied to an incoming side of the LED, are normally closed; and contacts of the relay RL which are connected which when closed allow voltage to be applied to the outgoing side of the LED, are normally open. A resistor R1 is provided between the ignition power IP and the incoming side of the LED. A resistor R2 is also provided between an outgoing side of the LED and the ground G to substantially restrict power from flowing through the LED when an alternative path to ground G is available through a filament of the light bulb B.

In the most preferred aspect of this invention the latching portion of the circuit LCP comprises a silicone controlled rectifier SCR having a gate G, an anode A and a cathode C, as well as a trigger circuit portion TCP configured to pulse the gate G when the switched light power control line Lc is energised, and wherein the switched light power control line Lc is connected to the anode A and a coil of the relay RL. The cathode is connected to one of the normally closed contacts of the relay RL and to the light bulb B.

Figure 6:
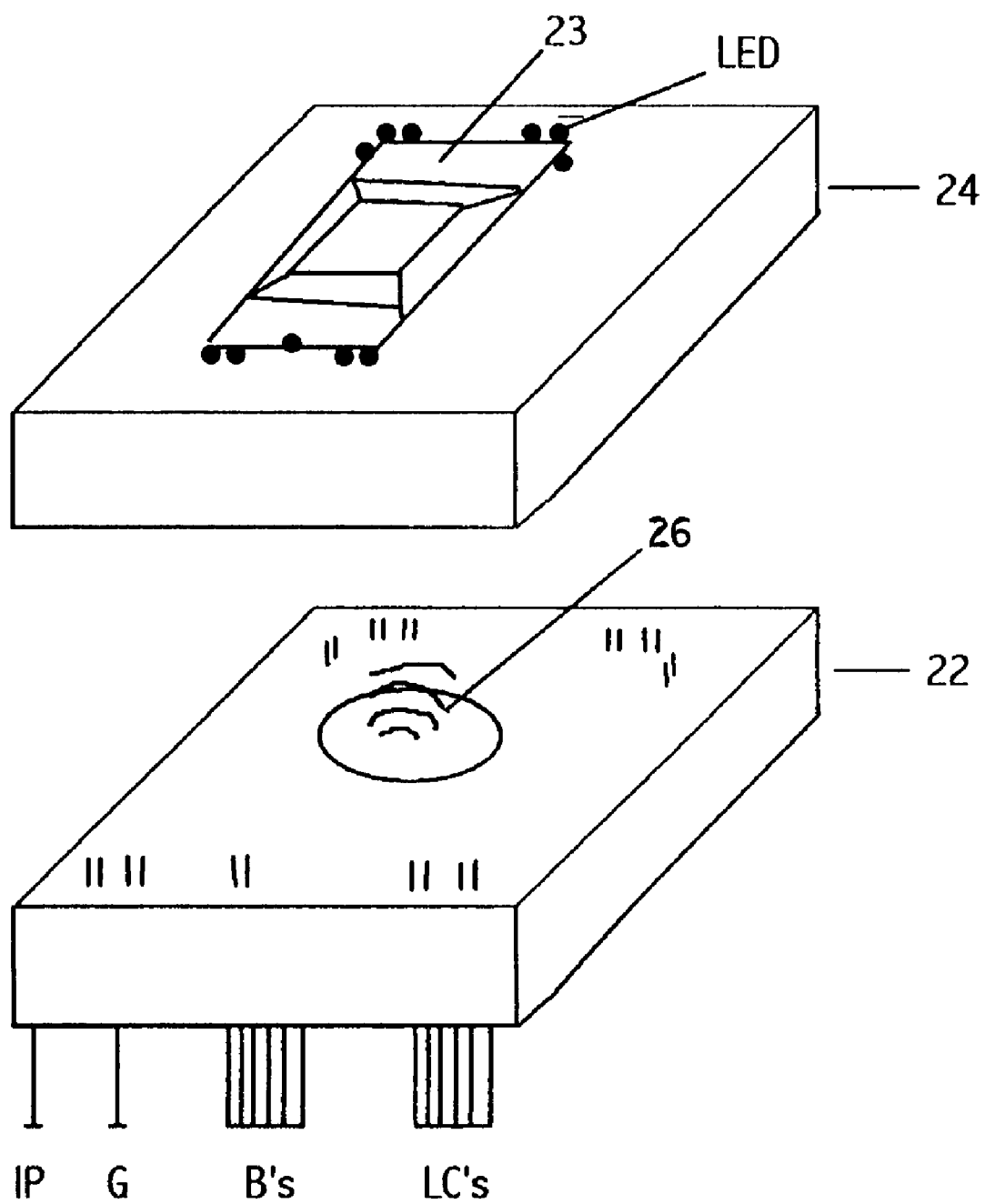
FIG. 6 is an exploded perspective view of multiple circuits provided on a removable chip, each circuit similar to those shown above but lacking a LED. LEDs are appropriately positioned on a shape of a vehicle on a top side portion of a display panel.

FIG. 6 is an exploded perspective view of multiple circuits 20 provided on a chip 22, each circuit 20 is similar to those shown above but lacking a LED. LEDs are appropriately positioned on a shape of a vehicle 23 on a top side portion of a display panel 24. The chip 22 may be removable. The chip 22 may comprise an audio alarm 26 configured to sound when a LED is lit. The alarm would be provided with an off switch which would be effective only until ignition power was switched off.

Without attempting to limit the generality of the foregoing description, it has been found that if resistors R1 and R2 are each 1K ohms, if resistor R3 is 10K ohms, and if capacitor C1 is 1 microfarad the circuit operates properly. Diodes D1 and D2 used were 1N914. The silicone controlled rectifier SCR was a 276-1067, manufactured by Radio Shack. The light emitting diode was a red T1.

Circuit Operation

Figure 2:
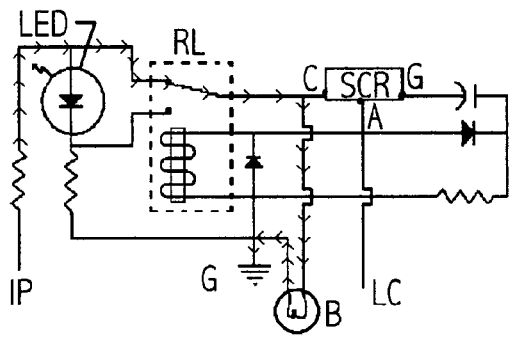
FIG. 2 is the schematic view as shown in FIG. 1 when the light bulb is switched off, and the light bulb is good.
Figure 3:
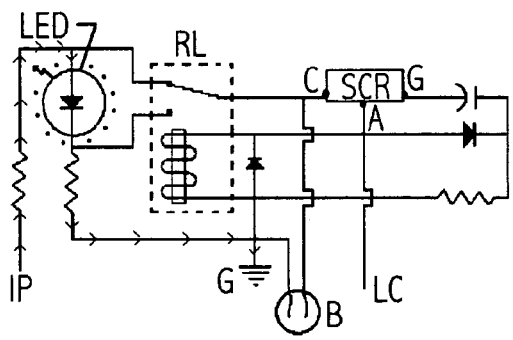
FIG. 3 is the schematic view as shown in FIG. 2 when the light bulb is switched off, but when the light bulb is burnt out, and consequently, the LED is lit.

In FIGS. 2 and 3 the bulb B is switched off. Referring to FIG. 2, wherein the bulb B is good, switched off, and ignition power is applied to the circuit, minimal current passes through R1, the normally closed contacts of the relay RL, and the filament of the bulb B, and on to ground. There is insufficient current passing through the LED and R2 to light the LED. This is a digital logic EXCLUSIVE OR gate. Referring to FIG. 3, wherein the bulb B is broken, current is unable to circulate through the filament of the bulb B. The incoming power circulates through R1, the LED, R2, and then to ground. The LED is lit indicating a broken bulb.

Figure 4:
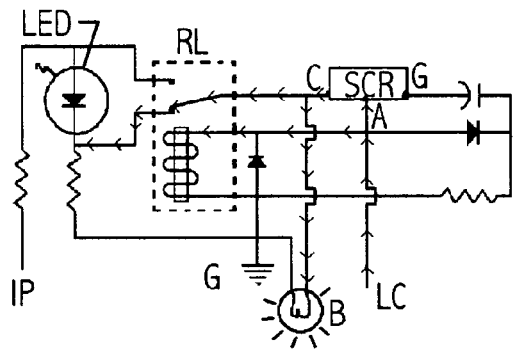
FIG. 4 is the schematic view shown in FIG. 1 when the light bulb is switched on and the bulb is good.
Figure 5:
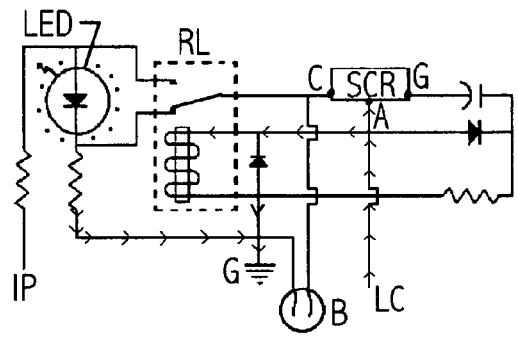
FIG. 5 is the schematic view shown in FIG. 4 when the light bulb is switched on, but when the light bulb is burnt out and consequently the LED is lit.

In FIGS. 4 and 5 the bulb B is switched on. Referring to FIG. 4, original switched power to the light initially pulses the gate G, of an SCR. The SCR then latches, or maintains electrical conductivity between its anode A and cathode C until power flowing between A and C is interrupted. Incoming switched power is also applied to the relay RL, closing its normally open contacts so that voltage is then applied to both sides of the LED so that the LED does not light. The C side of the SCR is also connected to the bulb B so that the bulb B lights. Referring to FIG. 5, wherein bulb B is broken, the SCR would be pulsed, but would not remain latched because power could not flow between A and C electrically connected to the broken filament of the bulb B. As in FIG. 3, power would flow through the LED to ground. The LED is lit indicating a broken bulb. It should be noted that if at anytime while bulb B is operating, and the filament therein is broken, so that current flowing through the bulb B is interrupted, the SCR will unlatch, so that the circuit will function as shown in FIG. 3, and described above.

While the invention has been described with preferred specific embodiments thereof, it will be understood that this description is intended to illustrate and not to limit the scope of the invention, which is defined by the following claims.

We claim:

1. A method of monitoring the operability of a light bulb, both while lit and/or unlit, comprising the steps of:

providing a circuit containing a LED, a relay and a latching circuit portion, said latching circuit portion configured to remain latched thereby applying power to the bulb and the relay only when the bulb is switched on and lit, and said relay having a pair of contacts connected to provide an alternative path of minimal resistance to ground for low voltage applied to an incoming side of the LED, and said relay also having an additional pair of contacts which when closed allow voltage to be applied to an outgoing side of the LED, thereby resulting in the LED lighting when and only when the light bulb is broken;

electrically connecting to the circuit, the light bulb to be monitored, ignition power, a switched light power control line, and ground.

2. A method as in claim 1 wherein the contacts of the relay which are connected to provide an alternative path of minimal resistance to ground for low voltage applied to the incoming side of the LED, are normally closed; and wherein the contacts of the relay which are connected which when closed allow voltage to be applied to the outgoing side of the LED, are normally open.

3. A method as in claim 2 wherein the latching portion of the circuit comprises a silicone controlled rectifier having a gate, an anode and a cathode, as well as a trigger circuit portion configured to pulse the gate when the switched light power control line is energized, and wherein the switched light power control line is connected to the anode and a coil of the relay, and wherein the cathode is connected to one of the normally closed contacts of the relay and to the light bulb.

4. A method as in claim 3 wherein a resistor is provided between the outgoing side of the LED and the ground to substantially restrict power from flowing through the LED when an alternative path to the ground is available through a filament of the light bulb.

5. A circuit to monitor the operability of a light bulb, both while lit and unlit, comprising:

a LED, a relay and a latching circuit portion, said latching circuit portion configured to remain latched thereby applying power to the bulb and the relay only when the bulb is switched on and lit, and said relay having a pair of contacts connected to provide an alternative path of minimal resistance to ground for low voltage applied to an incoming side of the LED, and said relay also having an additional pair of contacts which when closed allow voltage to be applied to an outgoing side of the LED, thereby resulting in the LED lighting when and only when the light bulb is broken.

6. A circuit as in claim 5 wherein the contacts of the relay which are connected to provide the alternative path of minimal resistance to the ground for low voltage applied to the incoming side of the LED, are normally closed; and wherein the relay contacts which are connected which when closed allow voltage to be applied to the outgoing side of the LED, are normally open.

7. A circuit as in claim 6 wherein the latching portion of the circuit comprises a silicone controlled rectifier having a gate, an anode and a cathode, as well as a trigger circuit portion configured to pulse the gate when a switched light power control line is energized, and wherein the switched light power control line is connected to the anode and a coil of the relay, and wherein the cathode is connected to one of the normally closed contacts of the relay and to the light bulb.

8. A circuit as in claim 7 wherein a resistor is provided between the outgoing side of the LED and the ground to substantially restrict power from flowing through the LED when an alternative path to the ground is available through a filament of the light bulb.

9. A method of monitoring the operability of multiple light bulbs, both while lit and/or unlit, comprising the steps of:
   providing LEDs arranged in a display panel having a front side portion representing a layout of the light bulbs, said layout having LEDs appropriately positioned thereon so as to correspond to the light bulbs in the layout;
   providing multiple circuits each circuit provided to monitor the operation of a particular one of the light bulbs, each circuit containing a relay and a latching circuit portion, said latching circuit portion configured to remain latched thereby applying power to the particular one of the bulbs and the circuit relay only when the particular one of the light bulbs is switched on and lit, and said relay having a pair of contacts connected to provide an alternative path of minimal resistance to ground for low voltage applied to an incoming side of a LED corresponding to the particular one of the bulbs, and said relay also having an additional pair of contacts which when closed allow voltage to be applied to an outgoing side of the LED corresponding to the particular one of the bulbs, thereby resulting in the LED corresponding to the particular one of the bulbs lighting when and only when particular one of the light bulb is broken;
   electrically connecting to the circuit, the light bulbs to be monitored, unswitched power, a switched light power control line, and ground.

10. A method as in claim 9 wherein the multiple light bulbs monitored are light bulbs on a vehicle, and wherein the LEDs are arranged in the display panel displaying a shape of the vehicle and having the LEDs positioned thereon to correspond to the light bulbs on the vehicle.

11. A method as in claim 10 wherein the vehicle display panel comprises a chip.

12. A method as in claim 11 wherein said chip comprises an audio alarm configured to sound when the LED that corresponds to the particular one of the light bulbs is lit.

* * * * *